(12) United States Patent
Chang et al.

(10) Patent No.: US 10,561,025 B2
(45) Date of Patent: Feb. 11, 2020

(54) METHOD OF MANUFACTURING POLYMER PRINTED CIRCUIT BOARD

(71) Applicant: BGT MATERIALS LIMITED, Manchester (GB)

(72) Inventors: Kuo-Hsin Chang, Chiayi County (TW); Jia-Cing Chen, Tainan (TW); We-Jei Ke, Hsinchu County (TW); Jingyu Zhang, Hweian County (CN); Chung-Ping Lai, Zhubei (TW)

(73) Assignee: BGT MATERIALS LIMITED, Manchester (GB)

(*) Notice: Subject to any disclaimer, the term of this patent is extended or adjusted under 35 U.S.C. 154(b) by 324 days.

(21) Appl. No.: 15/402,881

(22) Filed: Jan. 10, 2017

(65) Prior Publication Data

US 2018/0199441 A1    Jul. 12, 2018

(51) Int. Cl.
*H05K 3/38* (2006.01)
*H05K 1/03* (2006.01)
*H05K 3/16* (2006.01)
*H05K 3/18* (2006.01)

(52) U.S. Cl.
CPC .......... *H05K 3/388* (2013.01); *H05K 3/381* (2013.01); *H05K 1/0346* (2013.01); *H05K 3/16* (2013.01); *H05K 3/182* (2013.01); *H05K 3/188* (2013.01); *H05K 2201/0154* (2013.01); *H05K 2201/0257* (2013.01); *H05K 2201/0323* (2013.01); *H05K 2203/107* (2013.01)

(58) Field of Classification Search
CPC ......... H05K 1/0346; H05K 2201/0154; H05K 2201/0257; H05K 2201/0323; H05K 2203/107
See application file for complete search history.

(56) References Cited

U.S. PATENT DOCUMENTS

| | | | |
|---|---|---|---|
| 8,440,292 B2* | 5/2013 | Kanakarajan | C08L 63/00 174/258 |
| 10,237,976 B2* | 3/2019 | Kasuga | H05K 1/097 |
| 2008/0286488 A1* | 11/2008 | Li | B22F 1/0074 427/541 |
| 2009/0050204 A1* | 2/2009 | Habib | H01L 31/03529 136/261 |
| 2017/0062821 A1* | 3/2017 | Tour | H01M 4/625 |
| 2018/0199441 A1* | 7/2018 | Chang | H05K 3/381 |
| 2019/0174637 A1* | 6/2019 | Chang | H05K 3/381 |

* cited by examiner

*Primary Examiner* — Minh N Trinh
(74) *Attorney, Agent, or Firm* — Chun-Ming Shih; Lanway IPR Services

(57) ABSTRACT

A method of manufacturing a polymer printed circuit board contains steps of: A. providing a material layer consisting of polymer; B. forming circuit pattern on the material layer; C. depositing metal nanoparticles on the LIG of the circuit pattern so as to use as a metal seed; D. pressing the circuit pattern; and E. forming a metal layer on the LIG of the circuit pattern. In the step of B, the circuit pattern includes laser induced graphene, and the laser induced graphene is porous. Thereby, the circuit pattern is adhered on the material layer securely and has outstanding electric conductivity after being pressed in the step D.

9 Claims, 3 Drawing Sheets

METHOD OF MANUFACTURING POLYMER PRINTED CIRCUIT BOARD

FIELD OF THE INVENTION

The present invention relates to a method of manufacturing a printed circuit board, and more particular to a method of manufacturing a polymer printed circuit board.

BACKGROUND OF THE INVENTION

Methods of manufacturing printed circuit board (PCB) contain a subtractive method and a semi-additive method, etc. However, the subtractive method pollutes environment and increases production cost. As using the semi-additive method, cooper is etched decreasingly in deposition process.

As using the subtractive method to manufacture a printed circuit board which includes a copper clad laminate (CCL), and the CCL has a polymer substrate, a glass fiber, and a copper foil, wherein the copper foil is fixed on the polymer substrate and a main part of the copper foil is etched or eliminated. However, water consumption increases greatly as etching the copper foil in photolithography process and in rinsing process. Furthermore, chemical waste and heavy metals produce and pollute the environment.

As applying the semi-additive method to manufacture the printed circuit board, a copper layer is plated on the substrate in chemical deposition process (i.e., electroless deposition), and photoresist (PR) is fixed to expose circuit pattern, then the copper layer is plated on the circuit pattern. Thereafter, the PR is removed and the circuit pattern is etched so as to eliminate a part of the copper layer on the non-circuit pattern. However, copper consumption increases.

A photosintering method is disclosed in U.S. Publication No. 2015/0147486 A1 and U.S. 2008/0286488 A1 so as to manufacture metal pattern on the printed circuit board.

A laser method is disclosed in US Publication No. 2014/0120453 and is employed to manufacture micro-super capacitor. Laser induced graphene (LIG) materials and their use in electronic devices is disclosed in WO 2015175060 A3, but electric conductivity of the LIG is not high.

The present invention has arisen to mitigate and/or obviate the afore-described disadvantages.

SUMMARY OF THE INVENTION

The primary objective of the present invention is to provide a method of manufacturing a polymer printed circuit board which adheres the circuit pattern on the material layer securely and obtains outstanding electric conductivity on the circuit pattern after the circuit pattern is pressed.

To obtain above-mentioned objectives, a method of manufacturing a polymer printed circuit board provided by a first embodiment of the present invention contains steps of:
 A. providing a material layer consisting of polymer;
 B. forming circuit pattern on the material layer, wherein the circuit pattern is comprised of laser induced graphene, and the laser induced graphene is porous;
 C. depositing metal nanoparticles on the LIG of the circuit pattern so as to use as a metal seed;
 D. pressing the circuit pattern; and
 E. forming a metal layer on the LIG of the circuit pattern.

In a second embodiment, a method of manufacturing a polymer printed circuit board contains steps of:
 A. providing a material layer consisting of polymer;
 B. forming circuit pattern on the material layer, wherein the circuit pattern is comprised of laser induced graphene, and the laser induced graphene is porous;
 C. depositing metal nanoparticles on the LIG of the circuit pattern so as to use as a metal seed;
 D. forming a metal layer on the LIG of the circuit pattern; and
 E. pressing the circuit pattern.

Preferably, the material layer is a polymer film or a substrate on which the polymer is coated.

Preferably, the polymer is selected from the group of polyimide (PI) and polyetherimide (PEI).

Preferably, the LIG is formed on the material layer in a laser induction reacting process which is controlled by a computer.

Preferably, a predetermined area of the material layer is irradiated by laser beams in the laser induction reacting process, and a temperature of the predetermined area of the material layer rises up to at least 1500° C.

Preferably, the metal seed is selected from the group of platinum, gold, palladium, silver, copper, nickel, and zinc.

Preferably, in the step D, the circuit pattern is pressed in a rolling manner or in a laminating manner.

Preferably, the circuit pattern is pressed and is heated within a room temperature to a temperature of 500° C.

Preferably, the metal layer is formed on the LIG of the circuit pattern in any one of electroplating, electroless plating, and sputtering manners.

DETAILED DESCRIPTION OF THE PREFERRED EMBODIMENTS

Figure 1:
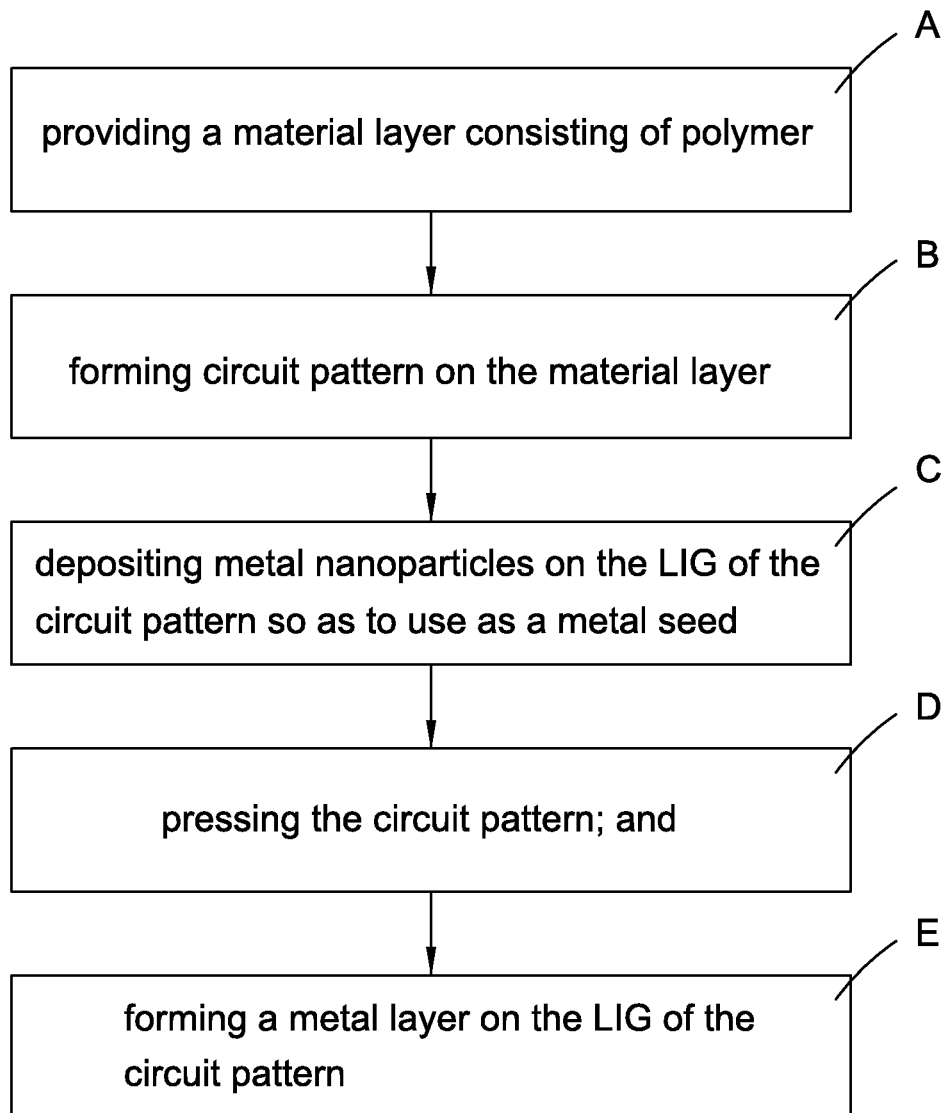
FIG. 1 is a flow chart of a method of manufacturing a polymer printed circuit board according to a first embodiment of the present invention comprise.
Figure 2:
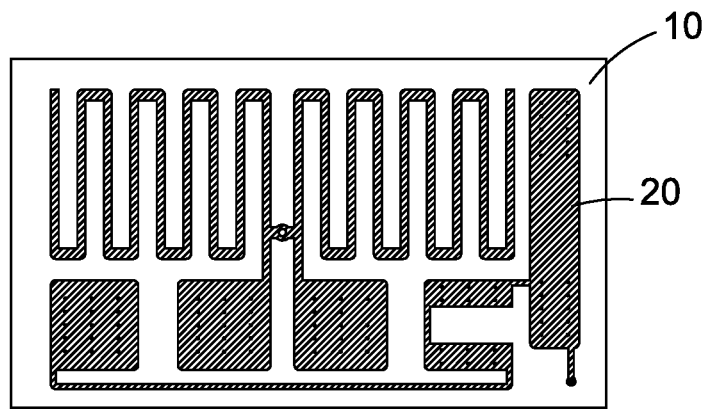
FIG. 2 is a schematic view showing the polymer printed circuit board is manufactured by the method of the first embodiment of the present invention comprise.
Figure 3:
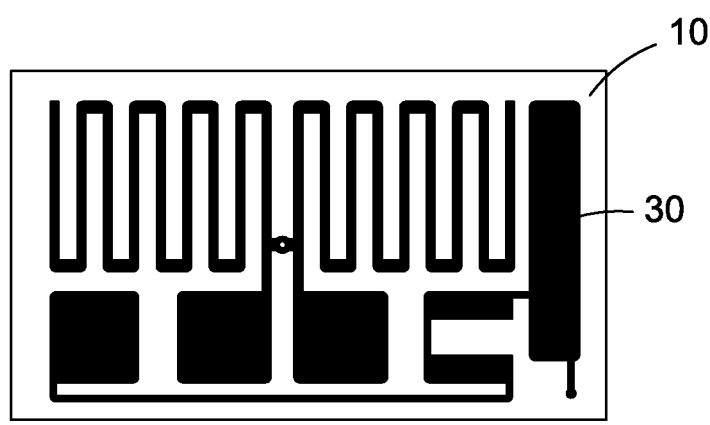
FIG. 3 is a schematic view showing a polymer printed circuit board is manufactured by a method of a second embodiment of the present invention comprise.

With reference to FIG. 1, a method of manufacturing a polymer printed circuit board according to a first embodiment of the present invention comprises steps of:
 A. providing a material layer 10 consisting of polymer;
 B. forming circuit pattern on the material layer 10, wherein the circuit pattern is comprised of laser induced graphene (LIG) 20, as shown in FIG. 2;
 C. depositing metal nanoparticles on the LIG 20 of the circuit pattern so as to use as a metal seed;
 D. pressing the circuit pattern; and
 E. forming a metal layer 30 on the LIG 20 of the circuit pattern, as illustrated in FIG. 3.

The material layer 10 is a polymer film or a substrate on which the polymer is coated. Preferably, the polymer is selected from the group of polyimide (PI) and polyetherimide (PEI).

The LIG 20 is formed on the material layer 10 in a laser induction reacting process which is controlled by a computer.

Preferably, the material layer 10 is a smooth surface, and the computer controls laser beams to heat a predetermined area of the material layer 10 on which the circuit pattern is formed, and the laser beams burn the polymer of the material layer 10 so as to carbonize or graphitize the polymer, thus producing conductive carbon or porous graphene on the circuit pattern 10, as shown in FIG. 2. Preferably, the predetermined area of the material layer 10 is irradiated by the laser beams and its temperature rises up to at least 1500° C., hence the polymer is carbonized or is graphitized to produce the conductive carbon or the porous graphene.

Preferably, the metal seed is selected from the group of platinum, gold, palladium, silver, copper, nickel, and zinc. And nanoparticles are used as the metal seed in the step E, hence the metal layer 30 connects with the LIG 20 quickly and has electric conductivity, as shown in FIG. 3. The metal layer 30 is formed on the LIG 20 of the circuit pattern in any one of electroplating, electroless plating, and sputtering manners so as to produce the polymer printed circuit board.

In the step D, the circuit pattern is pressed in a rolling manner or in a laminating manner by using a machine so that the circuit pattern is adhered on the material layer 10 securely and has outstanding electric conductivity. Preferably, the circuit pattern is pressed in a hot pressing manner in the step D and is heated within a room temperature to a temperature of 500° C.

Figure 4:
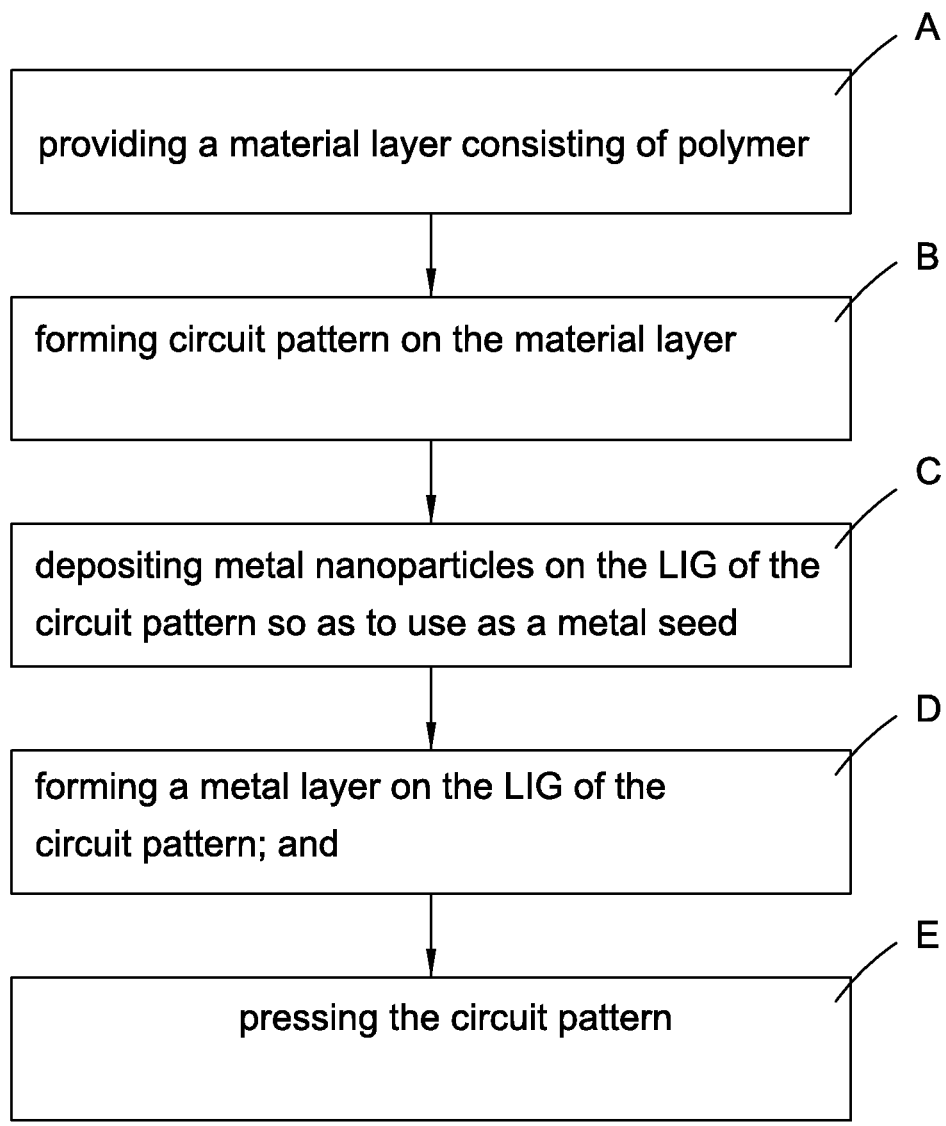
FIG. 4 is a flow chart of a method of manufacturing the polymer printed circuit board according to the second embodiment of the present invention comprise.

Referring to FIG. 4, a method of manufacturing a polymer printed circuit board according to a second embodiment of the present invention comprises steps of:

A. providing a material layer 10 consisting of polymer;

B. forming circuit pattern on the material layer 10, wherein the circuit pattern is comprised of laser induced graphene (LIG) 20;

C. depositing metal nanoparticles on the LIG 20 of the circuit pattern so as to use as a metal seed;

D. forming a metal layer 30 on the LIG 20 of the circuit pattern; and

E. pressing the circuit pattern on which the metal layer 30 is formed.

Thereby, the circuit pattern is adhered on the material layer 10 securely and has outstanding electric conductivity after being pressed in the step E.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method of manufacturing a polymer printed circuit board comprising in a sequential order steps of:
   A. providing a material layer consisting of a polymer film;
   B. forming circuit pattern on the material layer, wherein the circuit pattern is comprised of laser induced graphene (LIG), and the laser induced graphene is porous;
   C. depositing metal nanoparticles on the LIG of the circuit pattern so that the metal nanoparticles on the LIG of the circuit pattern is used as a metal seed of a meta layer formed on the LIG of the circuit pattern;
   D. pressing the circuit pattern on which the metal nanoparticles are deposited; and
   E. forming the metal layer on the LIG of the circuit pattern by using the metal seed, thus producing the polymer printed circuit board.

2. The method as claimed in claim 1, wherein the material layer further includes a substrate on which the polymer film is coated.

3. The method as claimed in claim 1 further comprising selecting from a group of polyimide (PI) and polyetherimide (PEI) as the polymer film.

4. The method as claimed in claim 1 further comprising forming the LIG on the material layer in a laser induction reacting process by controlling a computer.

5. The method as claimed in claim 4 further comprising irradiating a predetermined area of the material layer by using laser beams in the laser induction reacting process, and a temperature of the predetermined area of the material layer rises up to at least 1500° C.

6. The method as claimed in claim 1, wherein the metal seed is selected from a group of platinum, gold, palladium, silver, copper, nickel, and zinc.

7. The method as claimed in claim 1 further comprising pressing the circuit pattern in a rolling manner or in a laminating manner in the step D.

8. The method as claimed in claim 7 further comprising pressing and heating the circuit pattern within a room temperature to a temperature of 500° C.

9. The method as claimed in claim 1, wherein the metal layer is formed on the LIG of the circuit pattern in one of electroplating, electroless plating, and sputtering manners.

* * * * *